(12) United States Patent
Uchida et al.

(10) Patent No.: US 6,809,709 B2
(45) Date of Patent: Oct. 26, 2004

(54) ORGANIC ELECTRO-LUMINESCENCE DEVICE

(75) Inventors: Masahiro Uchida, Suwa (JP); Osamu Yokoyama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 53 days.

(21) Appl. No.: 09/825,850

(22) Filed: Apr. 5, 2001

(65) Prior Publication Data

US 2001/0045921 A1 Nov. 29, 2001

(30) Foreign Application Priority Data

Apr. 10, 2000 (JP) ........................................ 2000-108361
Apr. 4, 2001 (JP) ........................................ 2001-106280

(51) Int. Cl.[7] ................................................. G09G 3/30
(52) U.S. Cl. ............................ 345/76; 345/45; 345/36; 345/77; 345/80
(58) Field of Search ........................ 345/76, 45, 36, 345/77, 80

(56) References Cited

U.S. PATENT DOCUMENTS 6,091,382 A * 7/2000 Shioya et al. ................ 345/76

2003/0054186 A1  3/2003 Miyashita et al.

FOREIGN PATENT DOCUMENTS

| CN | 1212114 A | 3/1999 |
| JP | A-7-57873 | 3/1995 |
| JP | 07-057873 | 3/1995 |
| JP | U-3047168 | 1/1998 |

OTHER PUBLICATIONS

G. Gu, et al., "Transparent stacked organic light emitting devices. I. Design principles and transparent compound electrodes", *Journal of Applied Physics*, vol. 86, No. 8, Oct. 15, 1999, pp. 4067–4075.

* cited by examiner

Primary Examiner—Matthew C. Bella
Assistant Examiner—Tam Tran
(74) Attorney, Agent, or Firm—Oliff & Berridge, PLC

(57) ABSTRACT

The invention provides an organic electro-luminescence device which can be used as a cover glass of a wristwatch or the like by virtue of its transparency, produces a plurality of colors, illuminates and displays at the same time, and is formed by an easy method. A transparent organic EL device emitting yellow light is formed on a first surface of a substrate by being patterned so as to display characters. A transparent organic EL device emitting blue light is formed on a second surface by being patterned so as to generate light at the overall surface of the substrate.

8 Claims, 6 Drawing Sheets

[FIG. 1]
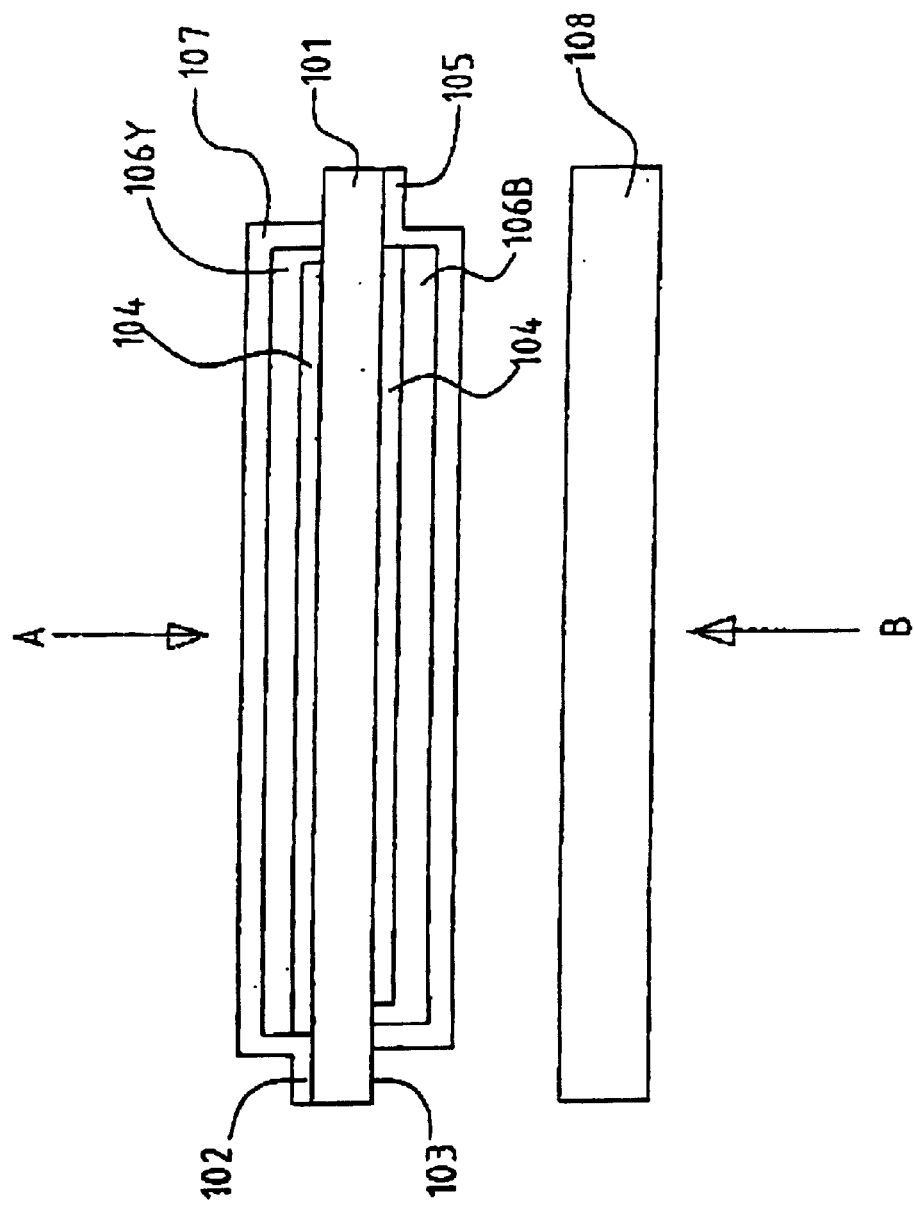

[FIG. 2]
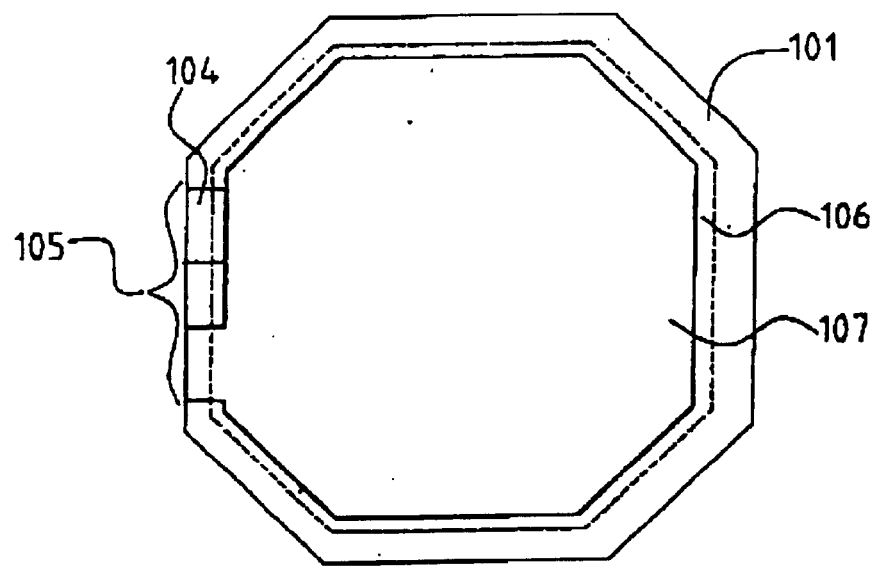
(a)
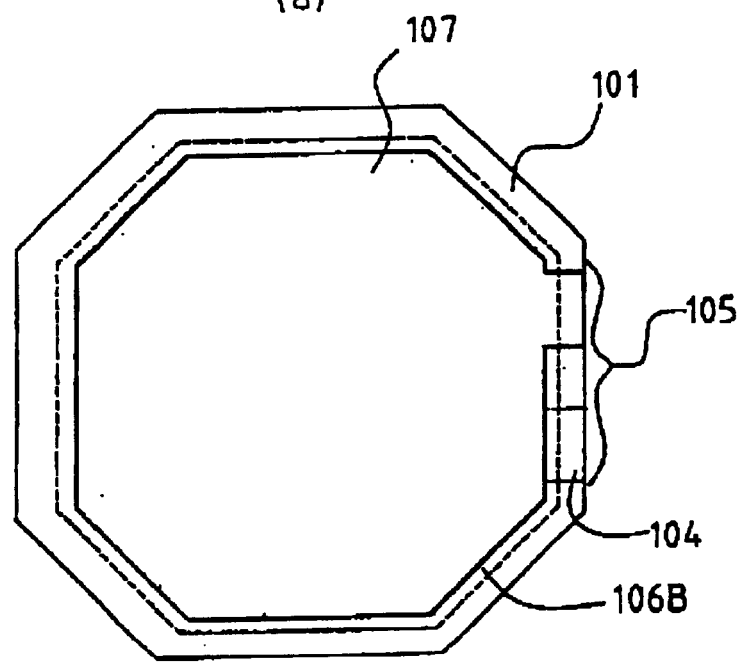
(b)

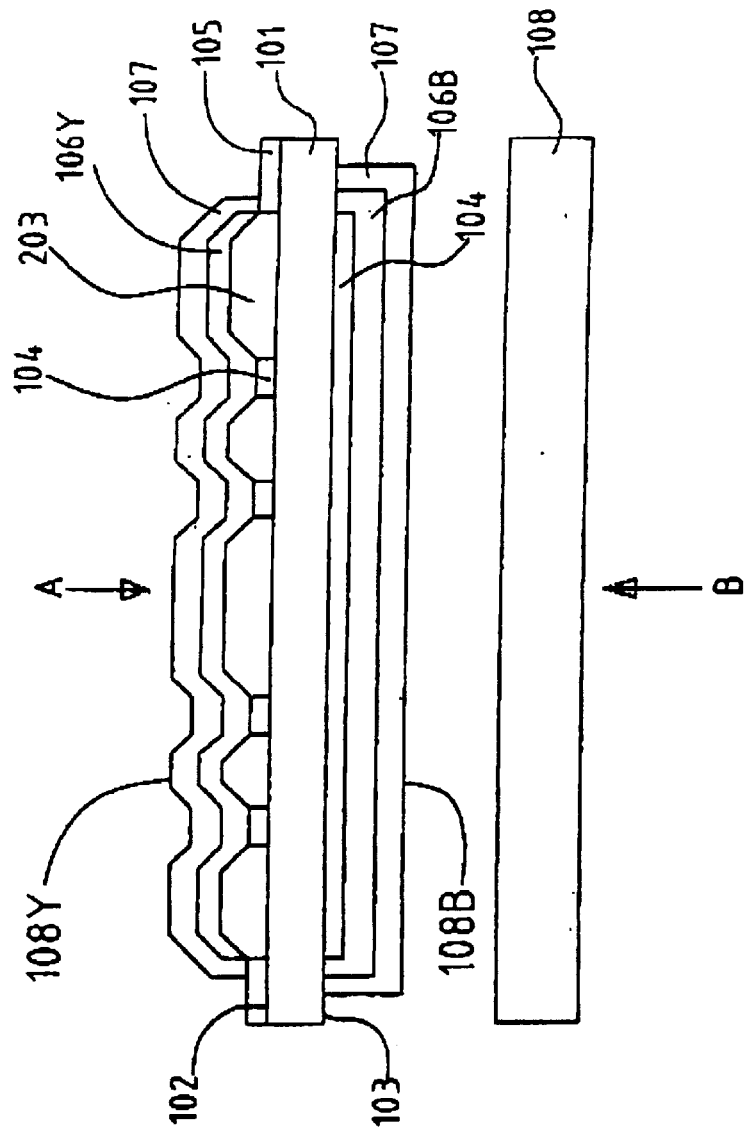
[FIG. 3]

[FIG. 4]
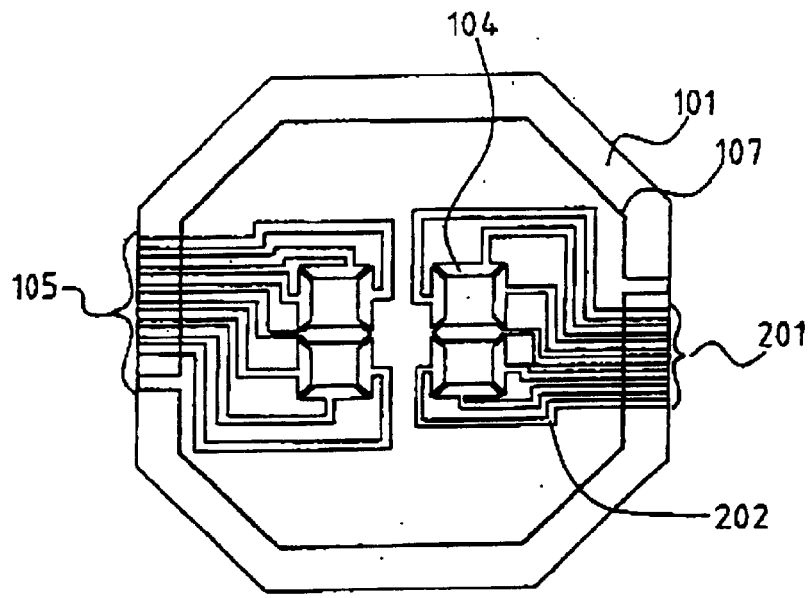
(a)
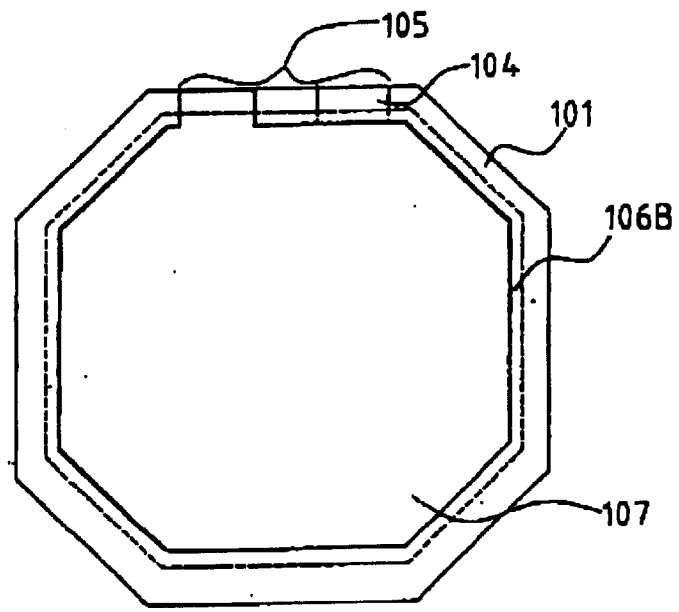
(b)

[FIG. 5]
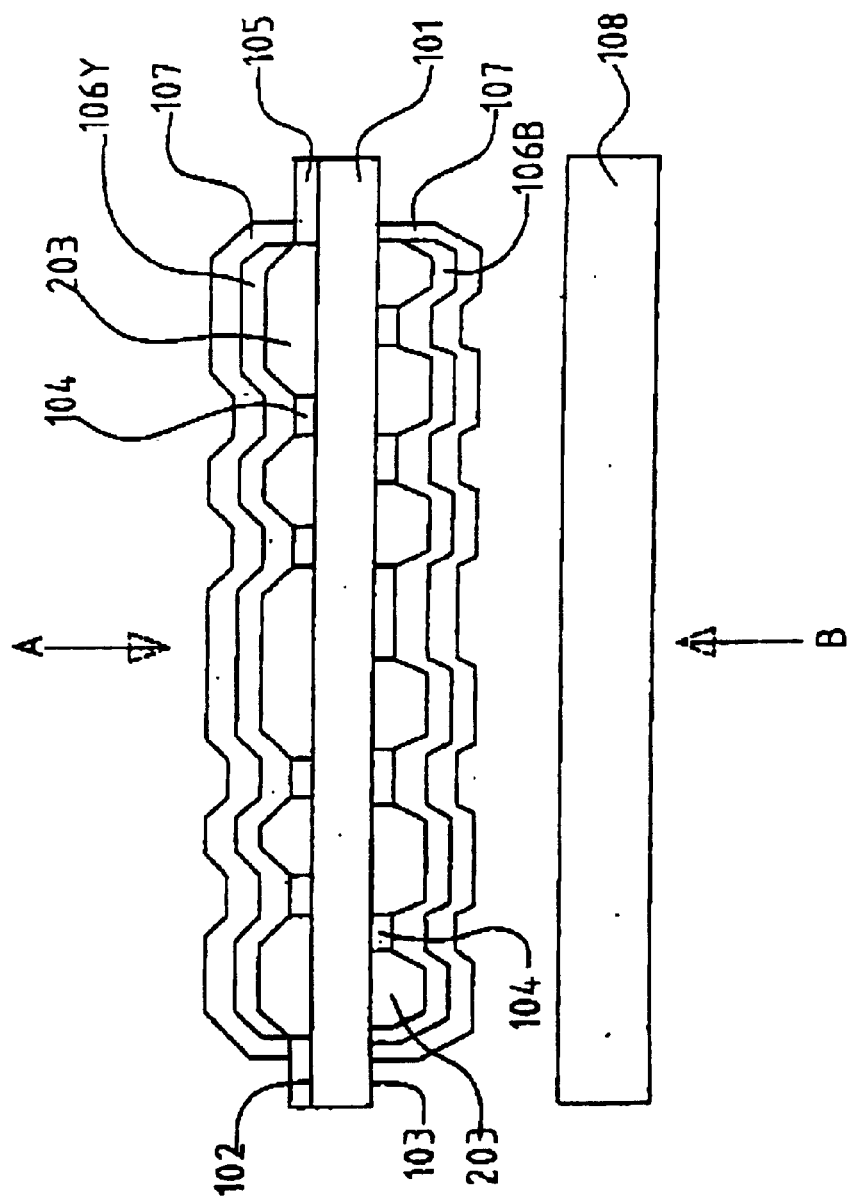

[FIG. 6]
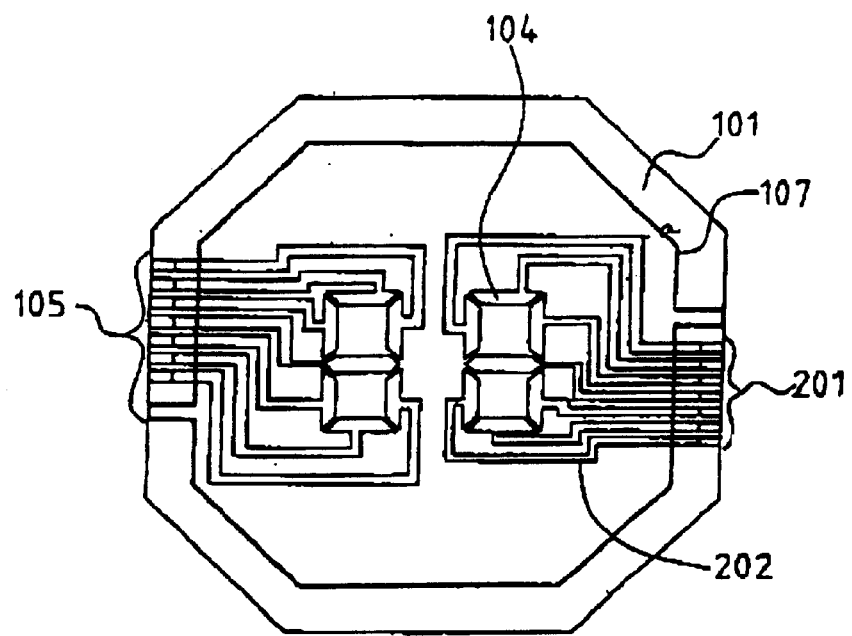
(a)
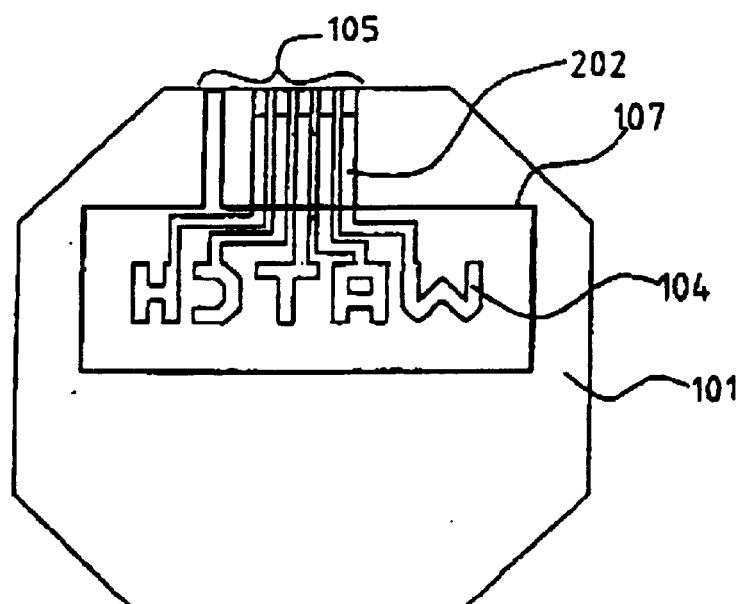
(b)

ORGANIC ELECTRO-LUMINESCENCE DEVICE

BACKGROUND OF THE INVENTION

1. Field of Invention

The present invention relates to illumination devices using organic electro-luminescence elements (hereinafter, "electro-luminescence" is referred to as "EL").

2. Description of Related Art

An organic EL device is a self-luminescent device wherein at least one organic luminescent layer is sandwiched by a cathode and an anode, which can be driven by a direct current voltage of approximately 3 volts and emit various colored lights. The organic EL device has many advantages as a display device, such as a high response speed and a large visual field angle, compared with a liquid crystal display device. Therefore, various practical applications of the organic EL device have been investigated, such as usage as a pixel for a display and as a light source.

Hitherto, in the organic EL device having such characteristics, a metallic thin film having a specular surface and being non-light-transmissible has been generally used as a cathode. In J. Appl. Phys., 86, 4067 (1999), an organic EL device is described in which a transparent cathode is used and a plurality of colored lights are emitted from both surfaces of a substrate.

However, in the above known technology, a structure, in which organic EL devices for individually emitting colored lights are laminated on each other, is used for emitting a plurality of colored lights, a problem has been found in that time and labor for manufacturing the structure are required. Further, it is practically difficult to prepare environment for manufacturing such a structure. Moreover, the assortment of solvents or the like is difficult to perform when a high-polymeric material is coated in a wet process such as spin coating instead of coating a low-molecular material by vapor deposition.

SUMMARY OF THE INVENTION

Accordingly, an object of the present invention is to provide a transparent organic EL device by forming organic EL devices on both surfaces of a substrate, each organic EL device being provided with at least one organic layer having a light-emitting function and being sandwiched by a transparent anode and cathode, whereby the organic EL device can display and illuminate in a plurality of colors.

An organic EL device in accordance with the invention includes an organic EL device formed on a light-transmissible and light-conductive substrate, the organic EL device including an anode, at least one organic layer having a light-emitting function, and a cathode, a first organic EL device being formed on a first surface of the substrate, the first organic EL device including the transparent anode and cathode, and a second organic EL device being formed on a second surface positioned opposite to the first surface of the substrate, the second organic EL device including the transparent anode and cathode.

With the above arrangement, an organic EL device which can display and illuminate in at least two colors can be provided.

The first organic EL element can be formed on the overall first surface of the substrate, and the second organic EL device can be formed on the overall second surface of the substrate.

With the above arrangement, an organic EL device which can display and illuminate in at least two colors can be provided.

The first organic EL element can be patterned on the first surface of the substrate so as to enable data display, and the second organic EL device can be formed on the overall second surface of the substrate.

With the above arrangement, an organic EL device which can display and illuminate in at least two colors can be provided.

The first and the second organic EL elements can be patterned on the first and the second surfaces, respectively, of the substrate so as to enable data display.

With the above arrangement, an organic EL device can be provided, which enables more complex data display by performing display and illumination in at least two colors and forming a pattern on each surface of the substrate which differs from the other.

The first and the second EL elements can individually emit colored lights differing from each other.

With the above arrangement, an organic EL device which can display and illuminate in at least two colors can be provided.

BRIEF DESCRIPTION OF THE DRAWINGS

FIG. 1 is a schematic sectional view of an organic electro-luminescence device according to an embodiment of the present invention.

FIG. 2(*a*) which is a plan view in a direction A, and FIG. 2(*b*) which is a plan view in a direction B, respectively, of the organic electro-luminescence device according to the embodiment of the present invention shown in FIG. 1.

FIG. 3 is a schematic sectional view of an organic electro-luminescence device according to another embodiment of the present invention.

FIG. 4(*a*) which is a plan view in a direction A, and FIG. 4(*b*) which is a plan view in a direction B, respectively, of the electro-luminescence device according to the other embodiment of the present invention shown in FIG. 3.

FIG. 5 is a schematic sectional view of an organic electro-luminescence device according to a further embodiment of the present invention.

FIG. 6(*a*) which is a plan view in a direction A, and FIG. 6(*b*) which is a plan view in a direction B, respectively, of the organic electro-luminescence device according to the further embodiment of the present invention shown in FIG. 5.

DETAILED DESCRIPTION OF PREFERRED EMBODIMENTS (First Embodiment)

FIG. 1 is a schematic sectional view showing a configuration according to a first embodiment of the present invention. FIG. 2(*a*) is a plan view in a direction A of the configuration shown in FIG. 1. FIG. 2(*b*) is a plan view in a direction B of the configuration shown in FIG. 1.

According to the first embodiment, a cover glass for a wristwatch is used as a substrate 101. On a first surface 102 of the substrate 101, an anode 104 is formed, an organic layer 106Y that emits yellow light is formed on the overall region except for an electrode-lead-terminal part 105, and a cathode 107 is formed. On a second surface 103 of the substrate 101, the anode 104 is formed, an organic layer 106B is formed on the overall region except for the electrode-lead-terminal part 105, and the cathode 107 is formed.

Although in the present embodiment, sapphire glass used as a cover glass for a wristwatch is used as the substrate 101, the material is not limited to this.

The anode 104 according to the present embodiment is formed by sputtering ITO (tin-doped indium oxide). IZO (zinc-doped indium oxide), Pt, Ir, Ni, Pd or the like may be also used. The film-forming method is not limited to sputtering, and an etching method may be used. Although the thickness of an anode is generally 50 to 500 nm, the anode is preferably thinner when it is used for a transparent device, as in the present embodiment.

Generally, an organic layer having a light-emitting function is preferably divided according to the functions into a hole-transfer layer, a light-emitting layer, and an electron-transfer layer. The organic layer 106Y that emits yellow light, according to the present embodiment, includes the hole-transfer layer formed in a thin film having a thickness of 50 nm by vacuum deposition of N,N'-diphenyl-N,N'-dinaphtyl-1,1'-biphenyl-4,4'-diamine. A thin film having a thickness of 50 nm is formed by vacuum co-deposition of a tris(8-hydroxyquinoline) aluminum complex, generally known as an electron-transfer light-emitting material, and rubrene, generally known as a fluorescent yellow coloring material.

The organic layer 106B that emits blue light is formed in the same manner as the organic 106Y except for rubrene which is replaced by perylene, generally known as a fluorescent blue coloring material.

The organic material to be used for the organic layer is not limited to these, and a functional high-polymeric thin-film formed by a spin coating method or by an ink-jet method may be used in the organic EL device. The color to be emitted is not limited to blue and yellow, and various colored lights, including white, may be used. The thickness of the organic layer is not limited to a particular level. The thickness of the organic layer is generally in the order of 5 to 500 nm, and is preferably 10 to 300 nm.

The cathode 107 according to the present embodiment may be made of any material which is transparent and electro-conductive. Although according to the present embodiment, ITO is used in the same manner as in the anode, the ITO may be formed on, for example, a thin film of an alloy of magnesium and silver so as to improve electron-injection property. The coating thickness of the cathode is not limited to a particular level as long as transparency can be ensured. Pt, Ir, Ni or Pd may be also used.

For example, when the organic EL device according to the present embodiment is mounted to a wristwatch as a cover glass thereof, and only the element formed on the first surface 102 is driven, yellow light is emitted. Thus, the organic EL device operating as a front-positioned-type element illuminates a dial 108 of the wristwatch in yellow at the front face of the dial 108. When the device formed on the second surface 103 is driven, blue light is emitted. Thus, the organic EL device operating as the front-positioned-type illumination element illuminates the dial of the wristwatch in blue at the front face of the dial. When the devices are simultaneously driven, white light, which is a mixture of yellow light and blue light, is emitted. Thus, the organic EL device operating as the front-positioned-type illumination element illuminates the dial of the wristwatch in white at the front face of the dial.

Since the organic EL device according to the present embodiment is transparent, the viewer can observe a non-illuminant element in a light place through the organic EL device according to the present embodiment.

The organic EL device according to the present embodiment can be used for illumination of a wristwatch, a reflective liquid crystal display, and the like.

(Second Embodiment)

FIG. 3 is a schematic sectional view of a configuration according to a second embodiment of the present invention. FIG. 4(*a*) is a plan view in a direction A of the configuration shown in FIG. 3. FIG. 4(*b*) is a plan view in a direction B of the configuration shown in FIG. 3. In FIG. 3, wiring for an anode is omitted. In FIGS. 4(*a*) and 4(*b*), the components are partly omitted for an easy view of the drawing.

In the second embodiment, a cover glass for a wristwatch is used as a substrate 101. On a first surface 102 of the substrate 101, an anode 104, electrode-lead terminals 105, and wires 202 connecting the anode to anode-lead terminals 201 are simultaneously formed by patterning. The overall region except for a display region for displaying a character of "8" and electrode-lead-terminal parts is covered by an insulative thin film 203. An organic layer 106Y that emits yellow light is formed on the overall region except for the electrode-lead-terminal part 105, and a cathode 107 is formed. On a second surface 103 of the substrate 101, the anode 104 is formed, an organic layer including an organic layer 106B that emits blue light is formed on the overall region except for the electrode-lead-terminal part 105, and the cathode 107 is formed.

Although the insulative thin film 203 covering the region except for a light-emitting region is made of $SiO_2$, according to the present embodiment, a polyimide-type high-polymeric thin film may be used. The insulative thin film according to the present embodiment functions to suppress light-emitting in regions other than the light-emitting region, to avoid electrical leaks, and the like. The configuration of the other components is the same as that according to the first embodiment.

For example, when the organic EL device according to the present embodiment is mounted to a wristwatch as a cover glass thereof, and only the element formed on the first surface 102 is lighted, the character of "8" is displayed with light emitted in yellow. When only the element formed on the second surface is driven, blue light is emitted. Thus, the organic EL device operating as a front-positioned-type illumination element illuminates the dial of the wristwatch at the front face of the dial. When the element formed on the first surface and the device formed on the second surface are simultaneously driven, the character of "8" is displayed in white so as to overlap the overall cover glass lighted in blue. Thus, the organic EL device also operating as a front-positioned-type illumination element illuminates the dial of the wristwatch at the front face of the dial. Data display other than the display of the character of "8" can be performed by integrating a separate particular driving circuit.

Since the organic EL device according to the present embodiment is transparent, the viewer can observe a non-illuminant element in a light place through the organic EL device according to the present embodiment.

The organic EL device according to the present embodiment can be used as a display and an illumination device for a wristwatch, a reflective liquid crystal display, and the like.

(Third Embodiment)

FIG. 5 is a schematic sectional view of a configuration according to a third embodiment of the present invention. FIG. 6(*a*) is a plan view in a direction A of the configuration shown in FIG. 5. FIG. 6(*b*) is a plan view in a direction B of the configuration shown in FIG. 5. In FIG. 5, wiring for an anode is omitted. In FIGS. 6(*a*) and 6(*b*), the components are partly omitted for an easier view of the drawing.

In the third embodiment, a cover glass for a wristwatch is used as a substrate 101. On a first surface 102 of the substrate 101, an anode 104, electrode-lead terminals 105, and wires 202 connecting the anode to anode-lead terminals 201 are simultaneously formed by patterning. The overall region except for a display region for displaying a character of "8" and electrode-lead-terminal parts is covered by an insulative thin film 203. An organic layer 106Y emitting yellow light is formed on the overall region except for electrode-lead-terminal parts, and a cathode 107 is formed. On a first surface 102 of the substrate 101, the anode 104, the electrode-lead terminals 105, and the wires 202 for connecting the anode to the anode-lead terminals 201 are simultaneously formed by patterning. The overall region except for the display region for displaying the character of "WATCH" and the electrode-lead-terminal parts is covered by the insulative thin film 203. An organic layer 106B emitting blue light is formed on the overall region except for the electrode-lead-terminal parts, and the cathode 107 is formed.

The components according to the present embodiment are the same as those used in the second embodiment.

For example, when the organic EL device according to the present embodiment is mounted to a wristwatch as a cover glass thereof, and only the element formed on the first surface 102 is lighted, the character of "8" is displayed with light emitted in yellow. When only the device formed on the second surface is driven, the viewer can observe the display of "WATCH" in blue light by viewing in the direction A shown in FIG. 5. When the element formed on the first surface and the element formed on the second surface are simultaneously driven, the viewer can observe the character of "8" in yellow and the display of "WATCH" in blue at the same time by viewing in the direction A shown in FIG. 5. The organic EL device operates as a front-positioned-type illumination element, which illuminates in a dark place, the dial of the wristwatch at the front face of the dial. Data display other than the display of the character of "8" can be performed by integrating a separate particular driving circuit.

Since the organic EL device according to the present embodiment is transparent, the viewer can observe a non-illuminant display in a light place through the organic EL device according to the present embodiment.

The organic EL device according to the present embodiment can be used as a display and an illumination device for a wristwatch, a reflective liquid crystal display, and the like.

As described above, the organic EL device according to the present invention, which includes transparent organic EL elements formed on both surfaces of a substrate, provides an advantage in that an illumination device can be formed by an easy method, the illumination device is capable of being used as a cover glass of a wristwatch or the like, producing a plurality of colors, and performing illumination and display at the same time.

What is claimed is:

1. An organic electro-luminescence device, comprising:
   a light-transmissible and light-conductive substrate having a first surface and a second surface opposite the first surface;
   a first organic electro-luminescence element formed on the first surface of the substrate, including a first transparent anode, a first organic light-emitting layer, and a first cathode; and
   a second organic electro-luminescence element formed on the second surface of the substrate, including a second transparent anode, a second organic light-emitting layer, and a second cathode,
   the first organic electro-luminescence element emits a first display light, the second organic electro-luminescence element emits a second display light, the first display light being driven independently from and emitted irrespective of an output of the second display light, and the second display light being driven independently from and emitted irrespective of an output of the first display light.

2. The organic electro-luminescence device according to claim 1, the first organic electro-luminescence element being formed on a substantial portion of the first surface of the substrate, and the second organic electro-luminescence element being formed on a substantial portion of the overall second surface of the substrate.

3. The organic electro-luminescence device according to claim 1, the first organic electro-luminescence element being patterned on the first surface of the substrate so as to enable data display, and the second organic electro-luminescence element being formed on the overall second surface of the substrate.

4. The organic electro-luminescence device according to claim 1, the first and the second organic electro-luminescence elements being patterned on the first and the second surfaces of the substrate, respectively, so as to enable data display.

5. The organic electro-luminescence device according to claim 1, the first and the second electro-luminescence elements individually emitting colored lights differing from each other.

6. The organic electro-luminescence device according to claim 2, the first and the second electro-luminescence elements individually emitting colored lights differing from each other.

7. The organic electro-luminescence device according to claim 3, the first and the second electro-luminescence elements individually emitting colored lights differing from each other.

8. The organic electro-luminescence device according to claim 4, the first and the second electro-luminescence elements individually emitting colored lights differing from each other.

* * * * *